US007191079B2

(12) United States Patent
Smith et al.

(10) Patent No.: US 7,191,079 B2
(45) Date of Patent: Mar. 13, 2007

(54) OSCILLOSCOPE HAVING ADVANCED TRIGGERING CAPABILITY

(75) Inventors: Patrick A. Smith, Beaverton, OR (US); Que Thuy Tran, Beaverton, OR (US); John C. Delacy, Portland, OR (US); Daniel G. Knierim, Beaverton, OR (US); David L. Kelly, Portland, OR (US); John C. Calvin, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/089,883

(22) Filed: Mar. 23, 2005

(65) Prior Publication Data

US 2005/0225310 A1  Oct. 13, 2005

Related U.S. Application Data

(60) Provisional application No. 60/555,899, filed on Mar. 23, 2004, provisional application No. 60/555,892, filed on Mar. 23, 2004, provisional application No. 60/555,900, filed on Mar. 23, 2004.

(51) Int. Cl.
*G01R 13/00* (2006.01)

(52) U.S. Cl. .............. 702/67; 702/66; 702/70; 702/79; 324/76.11

(58) Field of Classification Search ............... 702/67, 702/66, 69–71, 73, 74, 76, 79, 117, 120, 124–126, 702/176, 178, 189, 187, 193
See application file for complete search history.

(56) References Cited

U.S. PATENT DOCUMENTS

| | | | | |
|---|---|---|---|---|
| 4,823,076 A * | 4/1989 | Haines et al. | ............ | 324/121 R |
| 5,471,159 A * | 11/1995 | Stuebing et al. | .............. | 327/24 |
| 5,594,655 A * | 1/1997 | Berchin | ...................... | 702/77 |
| 5,675,729 A * | 10/1997 | Mehring | ...................... | 714/37 |
| 5,686,846 A * | 11/1997 | Holcomb et al. | ............. | 327/37 |
| 6,832,174 B2 * | 12/2004 | Tran et al. | .................. | 702/121 |
| 2004/0117138 A1* | 6/2004 | Tran et al. | .................... | 702/66 |
| 2004/0119620 A1* | 6/2004 | Tran et al. | .................. | 341/126 |
| 2004/0124848 A1* | 7/2004 | Tran et al. | .................. | 324/543 |

* cited by examiner

*Primary Examiner*—Hal Wachsman
(74) *Attorney, Agent, or Firm*—Thomas F. Lenihan

(57) ABSTRACT

An advanced trigger circuit includes two trigger decoders, each triggering on one of respective pluralities of continuous-time trigger events. In one embodiment, a programmable timer begins timing in response to an output signal of the first trigger decoder and generates an end-of-time signal at the expiration of its time period. A reset circuit resets the first trigger decoder if the second selected continuous-time trigger event failed to occur before the end-of-time signal was generated. In another embodiment, a reset decoder generates a reset signal in response to an occurrence of a selected continuous-time trigger event. The reset circuit is responsive to the reset signal for resetting the first trigger decoder if the second selected continuous-time trigger event failed to occur before the reset signal was generated. In other embodiments, the advanced trigger circuit triggers on a serial lane skew violation or on a beacon width violation.

35 Claims, 14 Drawing Sheets

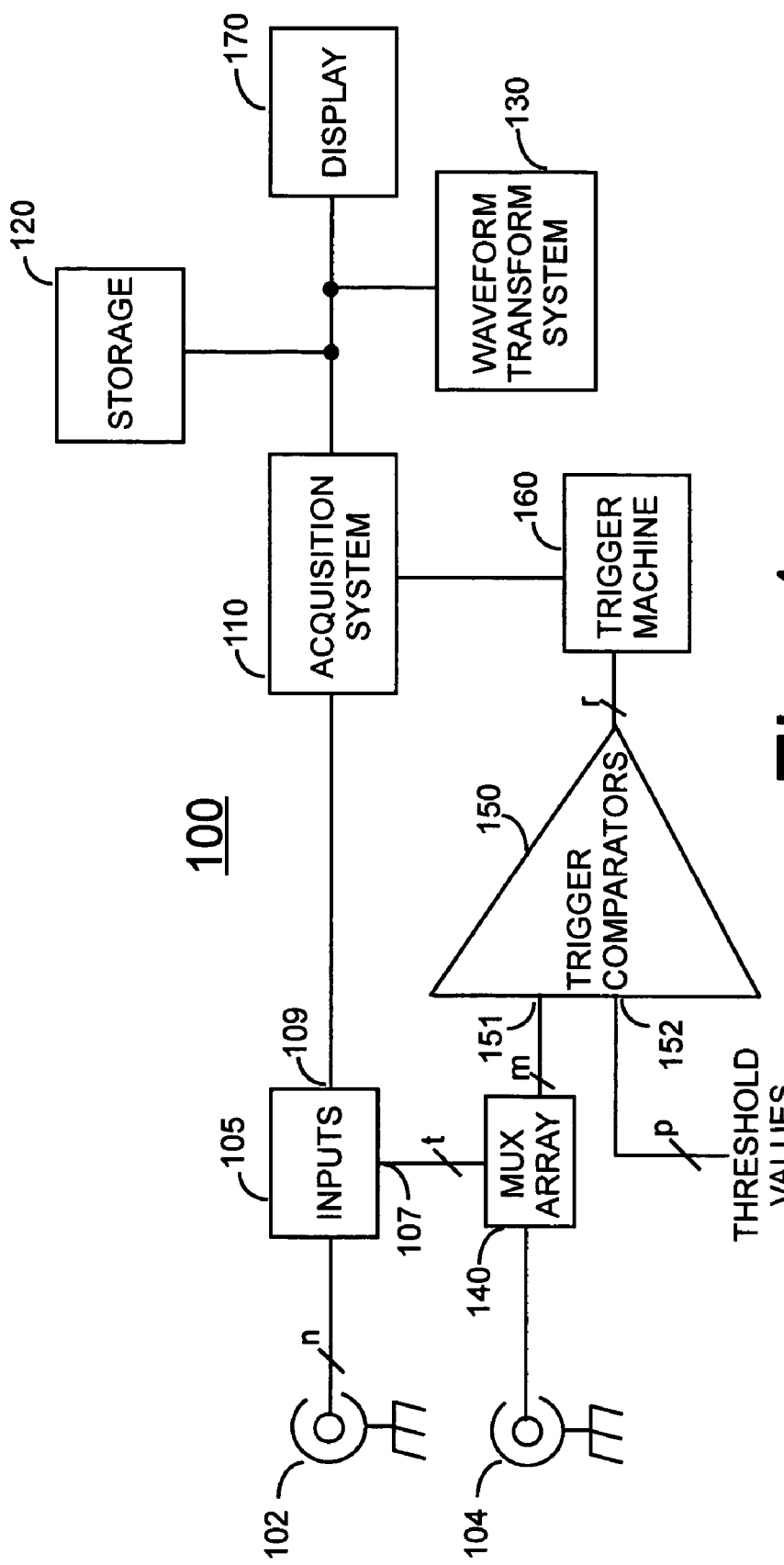

OSCILLOSCOPE HAVING ADVANCED TRIGGERING CAPABILITY

CLAIM FOR PRIORITY

The subject application claims priority from U.S. Provisional Patent Application Ser. No. 60/555,900 ADVANCED TRIGGERING (Smith, et al.) filed 23 Mar. 2004, and from U.S. Provisional Patent Application Ser. No. 60/555,892 SERIAL LANE SKEW VIOLATION TRIGGER FOR AN OSCILLOSCOPE (Tran, et al.) filed 23 Mar. 2004, and from U.S. Provisional Patent Application Ser. No. 60/555,899 SERIAL BEACON WIDTH VIOLATION TRIGGER (Tran, et al.) filed 23 Mar. 2004, all assigned to the same assignee as the subject application.

FIELD OF THE INVENTION

The subject invention generally relates to the field of triggered oscilloscopes, and specifically concerns an advanced trigger system for a modern digital oscilloscope.

BACKGROUND OF THE INVENTION

An oscilloscope is an electronics test and measurement instrument used by an engineer to acquire and display a waveform of interest from a particular test point of a circuit under test. The earliest oscilloscopes had no triggering capability, and as a result were unable to produce a stable display of the waveform of interest. Triggering circuitry was added to early analog oscilloscopes to provide stability to the display, by always starting the drawing of the waveform on the oscilloscope screen in response to detection of a trigger event. Thus, occurrence of the trigger event would cause the waveform to be displayed in a stable fashion at the same place on the screen.

Modern real time digital storage oscilloscopes (DSOs) also employ trigger systems to achieve stable displays, but they operate in a substantially different way. A DSO continuously acquires sample points and stores them in a circularly arranged acquisition memory. That is, when the last memory location in the acquisition memory is filled, a memory pointer is reset to the top of the acquisition memory and the samples continue to be acquired and stored. The samples collected before receipt of a trigger event are known as pre-trigger data. The detection of a trigger event sets the "zero" time position for the acquisition, and following samples collected are known as post-trigger data. Another trigger will not be accepted until the acquisition of the post-trigger data is complete.

Stated another way, a trigger system employs technology that enables engineers to capture (trigger on) signals relative to a specific event in time. The technology is typically used for troubleshooting (i.e., debugging) high-speed digital circuits to identify events that cause improper operation of those circuits. A desired trigger event can be a result of unexpected analog or digital operation that occurs at a single point in time (an anomaly) or as a result of a logic sequence.

Modern DSOs have been enabled to trigger on a large variety of events. The most commonly selected trigger is Edge Trigger, which examines the signal under test for an occurrence of either positive-going or negative-going vertical transition. In addition, a list of advanced triggers known in the art comprises: Glitch, runt, pulse width, level, pattern, state, setup & hold violation, logic-qualified, time-out, predetermined window, a predetermined period, time-qualified transition, time-qualified pattern, and serial data triggering.

Sequential triggering is also known in the art and is useful when it is necessary to trigger the instrument from two different signals. In known sequential triggering systems, a main (or A) trigger event is selected from a menu of possible trigger events, and a delayed (or B) trigger event is engaged. Known oscilloscope sequential triggering systems provided no choice of trigger event for the B trigger. In sequential triggering the A-trigger arms the oscilloscope to trigger upon receipt of the B-trigger edge.

A form of sequential triggering is also known in the logic analyzer prior art. However, logic analyzer triggering is clock-based, not continuous. That is, a logic analyzer samples a trigger event with its sampling clock. In an oscilloscope, the trigger event is applied in analog form to a trigger comparator; there is no clock involved. A continuous-type trigger is required in an oscilloscope in order for the oscilloscope to precisely locate the trigger point in time with respect to the received data. Moreover, logic analyzers do not respond to "analog" triggers (i.e., those that require comparison to at least two thresholds, such as, rise time, fall time, window, runt, etc.). Finally, logic analyzers do not employ coupling modes other than DC coupling.

Unfortunately, even a DSO with all of the above-recited triggering functions cannot trigger on certain compound events as found in today's ever more complex circuitry.

SUMMARY OF THE INVENTION

Apparatus according to the subject invention includes first and second trigger decoders, each triggering on one of respective first and second pluralities of continuous-time trigger events. In one embodiment, a programmable timer begins timing in response to an output signal of the first trigger decoder and generates an end-of-time signal at the expiration of its time period. A reset circuit is responsive to the end-of-time signal of the timer for resetting the first trigger decoder if the second selected continuous-time trigger event failed to occur before the end-of-time signal was generated. In another embodiment, a reset decoder generates a reset signal in response to an occurrence of a selected continuous-time trigger event. The reset circuit is responsive to the reset signal for resetting the first trigger decoder if the second selected continuous-time trigger event failed to occur before the reset signal was generated. In another embodiment of the invention, the advanced trigger circuit is programmed to trigger on a serial lane skew violation. In yet another embodiment of the invention, the advanced trigger circuit is programmed to trigger on a beacon width violation.

BRIEF DESCRIPTION OF THE DRAWING

FIG. 1 shows, in block diagram form, oscilloscope circuitry of the subject invention.

DETAILED DESCRIPTION OF THE EMBODIMENTS

Figure 2A:
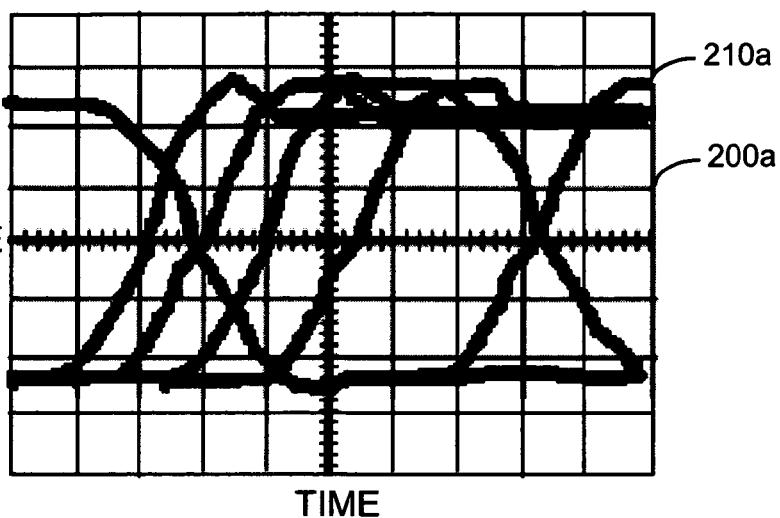
FIGS. 2a, 2b, and 2c show illustrations of screen displays useful in understanding the invention.

FIG. 1 shows a high-level block diagram of a digital storage oscilloscope (DSO) 100 according to the subject invention. Oscilloscope 100 includes an input 102 for receiving a signal under test (SUT) from a user's circuit. Although shown as a single connector for simplicity, input 102 actually comprises a number n of input channels (where n is any reasonable number, but usually 1, 2, 4 or 8). The n signal lines are applied to an input block 105 representing the "front end" of the oscilloscope including, buffer amplifiers, attenuation circuitry, and the like for conditioning the input signal. Input block 105 has a first output I for providing signals over a number of lines t to a first input of a Multiplexer (Mux) Array unit 140, and a second output terminal 109 for providing the conditioned input signal to an Acquisition System 110 wherein signal samples are taken repeatedly, are converted to digital form, and are stored in a circular acquisition memory. Mux Array 140 has a second input coupled to an External Trigger-in connector 104 for receiving an externally applied trigger signal, if any. Mux Array 140 applies a number m of signals to a first input 151 of Trigger Comparators unit 150.

Trigger Comparators unit 150 has a second input 152 coupled to receive a number p of threshold values from a controller (not shown for simplicity). Trigger Comparators unit 150 is programmable by a user to detect numerous different trigger conditions, as will be explained in detail below. Trigger Comparators unit 150 generates output signals upon detection of a predetermined trigger conditions, and couples the output signals over a number r of lines to an input of a Trigger Machine 160. In response, Trigger Machine 160 provides a signal to Acquisition System 110 to associate a particular portion of the input signal with the triggering event. Advantageously, Trigger Comparators unit 150 also includes various coupling arrangements (i.e., DC coupling, AC coupling, High Frequency Reject, etc.) that may be selected by a user via a front panel control or menu selection. Trigger Comparators unit also includes some slope control. The operation of Trigger Machine 160 will be explained below with respect to FIG. 3.

In response to the detection of a trigger event, Acquisition Circuit 110 continues to acquire post-trigger data for some predetermined number of samples, then stops. At this point, the acquired data may be moved to a Storage Memory 120 and may be processed by a Waveform Transform System 130 for display on a Display 170.

A brief review of oscilloscope triggering may be helpful in understanding the subject invention. FIG. 2a shows an example of an oscilloscope display in which the oscilloscope is untriggered while operating in Automatic Trigger mode. Automatic Trigger mode uses an internal timer to generate a trigger signal after a trigger event occurs. If a subsequent trigger event does not occur before the timer expires, then the timer-generated trigger signal will be used. The result is that the waveforms that are captured are not synchronized to one another. Thus, the display of these waveforms will not begin at the same point on the display screen.

Figure 2B:
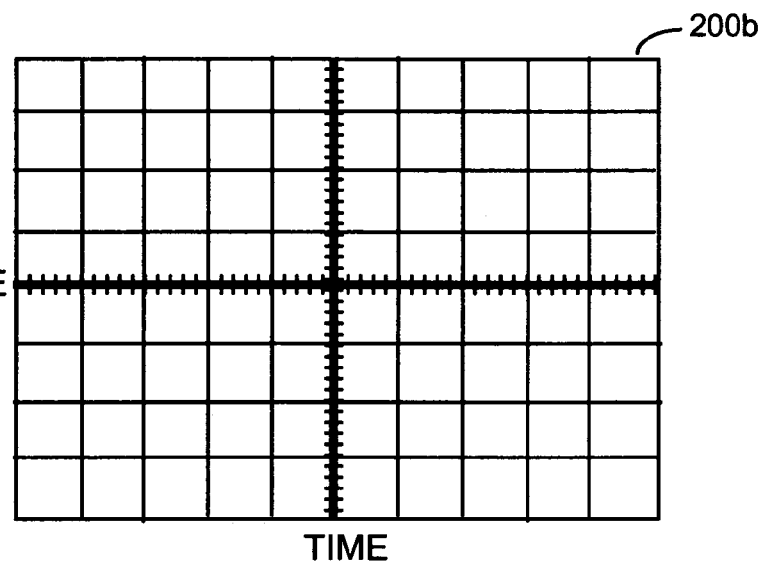

FIG. 2b shows an example of an oscilloscope display in which the oscilloscope is untriggered while operating in Normal Trigger mode. In Normal Trigger mode, the oscilloscope will not acquire a waveform until a trigger condition is detected. Thus the display screen will be blank until the trigger occurs (or the last waveform will be "frozen" on the display until the next trigger occurs).

Figure 2C:
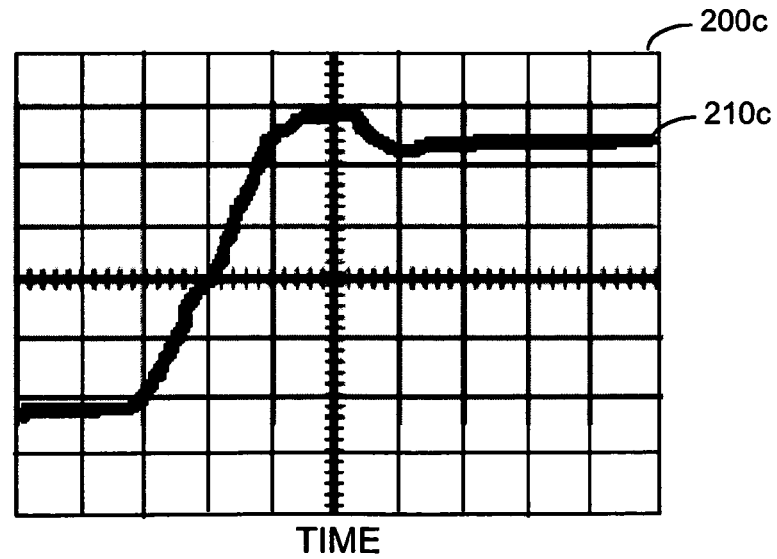

FIG. 2c shows an example of an oscilloscope display in which the oscilloscope is triggered while operating in either of the two above-described modes of operation. That is, when valid triggers occur, the waveform display appears stable.

Figure 3:
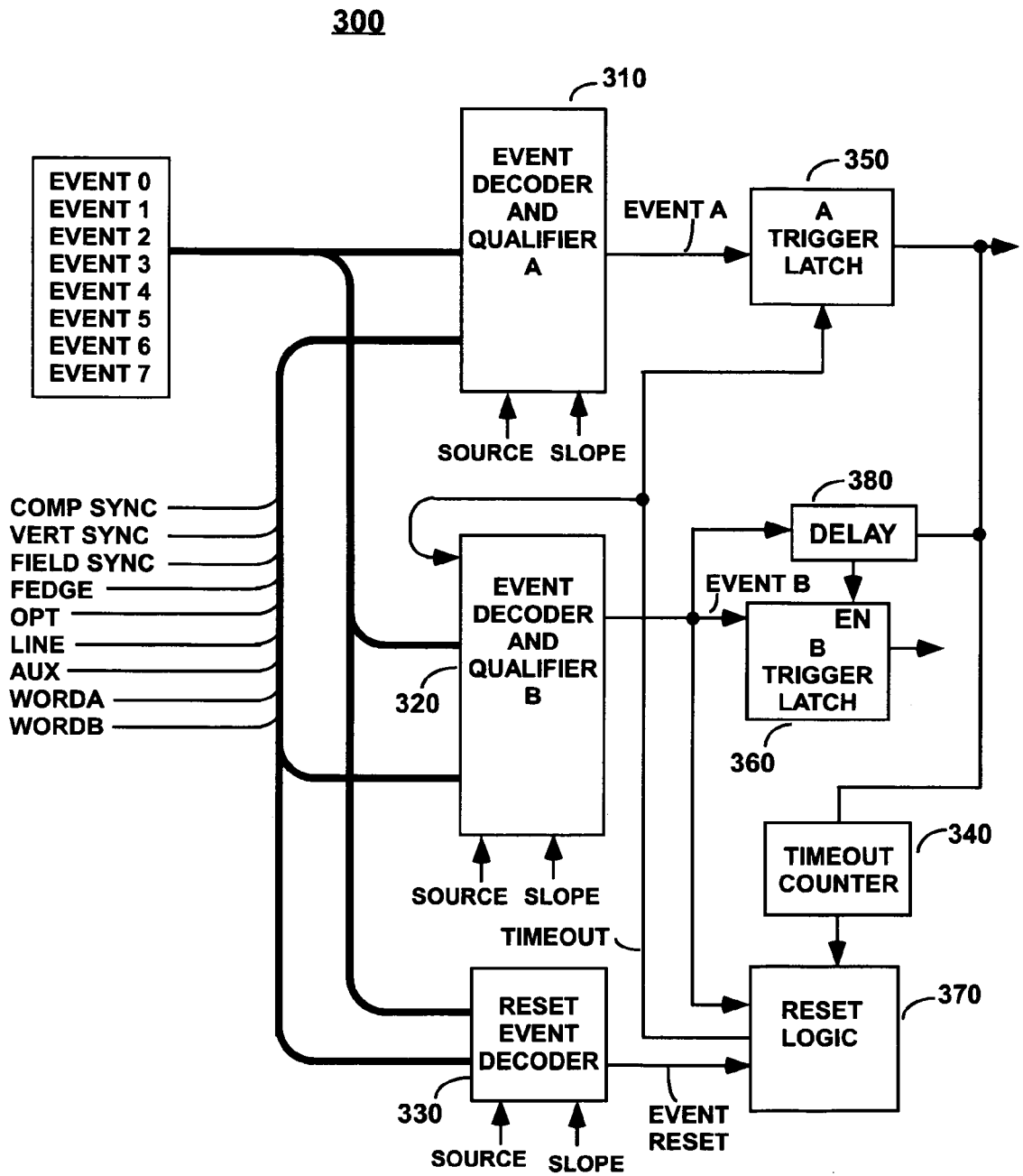
FIG. 3 shows, in block diagram form, trigger circuitry of the subject invention.

FIG. 3 shows a simplified illustration of an Event Decoder portion 300 of Trigger Machine 160 of FIG. 1. Note that Event Decoder 300 includes an Event Decoder and Qualifier A 310, an Event Decoder and Qualifier B 320, a Reset Event Decoder 330, and a Timeout Timer 340. The output signal of Event Decoder and Qualifier A 310 is latched by an A Trigger Latch 350 and applied via a programmable delay element 380 to an Enable (EN) input on a B Trigger Latch 360. The output signal of Event Decoder and Qualifier B 320 is latched by B Trigger Latch 360. It is important to note that a Timeout Timer 340 begins timing when A Trigger Latch 350 produces a "True" logic level output signal. A Reset Logic Block 370 can be programmed to produce an output signal if it receives a signal from Reset Event Decoder 330, or if it receives an End-of-time signal from Timeout Timer 340 or a more complex combination of a B-Event and Reset Event Decoder outputs. In any of these cases, the output signal from Reset Logic Block 370 is applied to A-Trigger Latch 350 to reset it, and thereby to prevent Event Decoder and Qualifier B 320, and its associated B Trigger Latch 360, from looking for its trigger event. It should be understood that Reset Logic Block 370 can also be programmed to not reset A-Trigger Latch 350. Moreover, the End-of-time signal itself may be used as a trigger event.

Note that each of Event Decoder and Qualifier A 310, Event Decoder and Qualifier B 320, and Reset Event Decoder 330 include source and slope control inputs that are controlled by a controller (not shown) in response to user selection via front panel controls, or a menu.

In one embodiment, Event 0 through Event 3 result from comparing input signals from channels 1–4 to a predetermined set of four trigger levels in a first group. Event 4 through Event 7 result from comparing input signals from channels 1–4 to a predetermined set of four trigger levels in a second group. Other trigger sources, collectively referred to as "auxiliary sources", are shown in FIG. 3 and include three video signal triggers (COMP SYNC, VERT SYNC, and FIELD SYNC). Yet another auxiliary trigger source is FEDGE (i.e. fast edge, a calibration signal from an external trigger source). A further auxiliary trigger source is OPT (option). Still another auxiliary trigger source is AUX (an external trigger-in terminal). Finally, the outputs of two word recognizers (WORD A and WORD B) may be used to trigger the oscilloscope.

Figure 4:
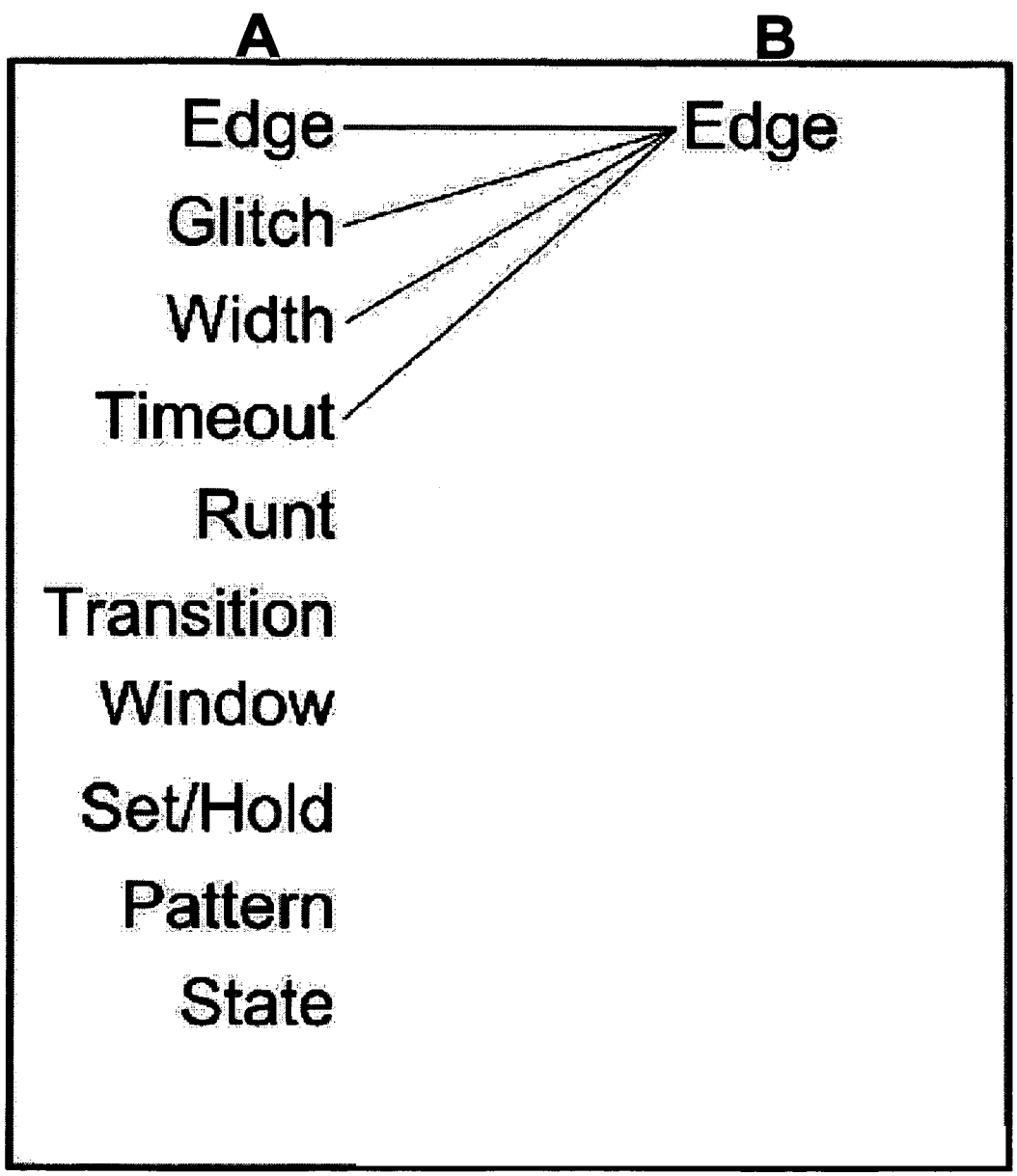
FIG. 4 is an illustration showing trigger combinations of prior art instruments.

Because of this unique architecture, the advanced triggering of the subject invention goes far beyond prior art triggering systems. FIG. 4 is an illustration of the sequential triggering capabilities of prior art TDS7000-series oscilloscopes manufactures by Tektronix, Inc. Beaverton, Oreg. In this regard, it should be noted that early Tektronix TDS7000-series oscilloscopes provided only nineteen trigger combinations. Nine of these were combinations of subsequent Edge Triggering with standard A-Event triggers. Two were combinations with optional A-Event triggers (Comm and Serial). Four were ways to trigger on Edge with TrigAfterTime (i.e., after Edge, Glitch, Width, and Timeout); and four were ways to trigger on Edge with TrigOnNthEvent (i.e., after Edge, Glitch, Width, and Timeout).

Figure 5:
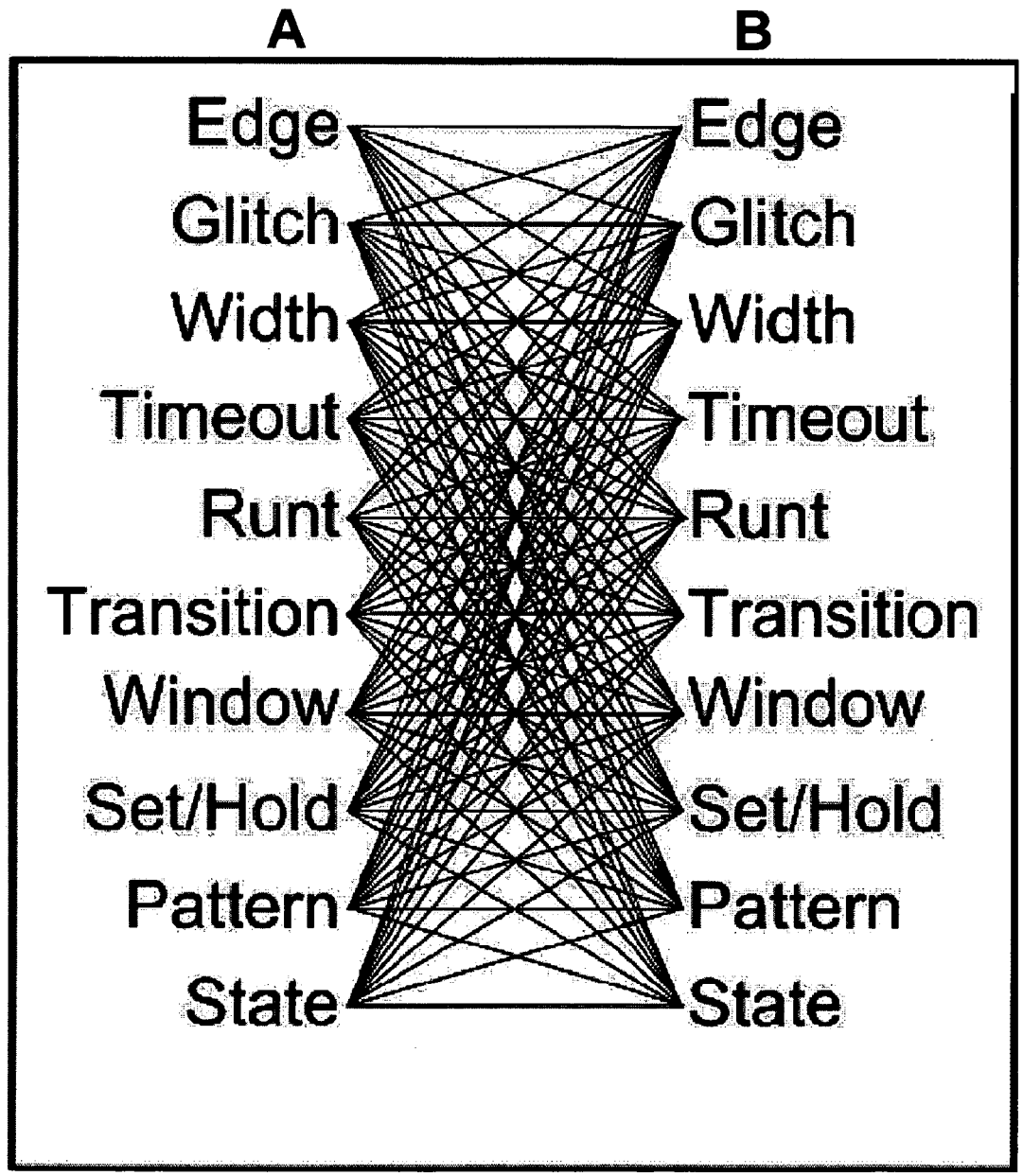
FIG. 5 is an illustration showing trigger combinations of the subject invention.

Not only does apparatus according to the subject invention provide the above-listed capabilities, but in addition, it also provides the full range of trigger types for the B-trigger mode. These additional capabilities are illustrated in FIG. 5. While the B-Trigger list could be identical to the A-Trigger list, there is no reason that requires the lists to be the same. In addition the B triggering can also further be logic qualified, giving the user the ultimate flexibility in triggering on high-speed digital signals. Rather than merely nineteen combinations, apparatus in accordance with the subject invention provides at least 1447 trigger combinations. This is possible because the architecture of the subject invention provides seventeen A-Event triggers (10 standard types+7 logic-qualified), seventeen B-Event triggers (10 standard types+7 logic-qualified), two optional A-Trigger-Only trigger types (Comm and Serial) and importantly, three Reset qualifications to TrigAfterTime and TrigOnNthEvent.

Specific details are as follows.

| | |
|---|---|
| 289 TrigAfterTime combinations | (17 × 17 = 289). |
| 289 TrigOnNthEvent combinations | (17 × 17 = 289). |
| 289 ResetByTime TrigAfterTime combinations | (17 × 17 = 289). |
| 289 ResetByTime TrigOnNthEvent combinations | (17 × 17 = 289). |
| 68 ResetByState TrigAfterTime combinations | (17 × 4 = 68). |
| 68 ResetByTransition TrigAfterTime combinations | (17 × 4 = 68). |
| 68 ResetByState TrigOnNthEvent combinations | (17 × 4 = 68). |
| 68 ResetByTransition TrigOnNthEvent combinations | (17 × 4 = 68). |
| 17 A-Trigger-Only standard trigger types | (17 × 1 = 17). |
| 2 A-Trigger-Only optional trigger types | (2 × 1 = 2). |

While the above-given list totals to 1447 trigger combinations, it should be understood that these details are provided by way of example, and not by way of limitation. In fact, other trigger conditions, such as period may be added to the A and B trigger-types, and Serial and Comm, may be added to the B-Trigger types, and all are intended to be part of the subject invention.

It is important to note that each of Event Decoder and Qualifier 310, 320 uses the channel 1 through channel 4 inputs independently. Because of the multiple trigger comparators in Trigger Comparators unit 150, the comparators may be programmed with different threshold values. Thus, each can use different trigger levels for comparison against the same input data.

A problem has existed in prior art oscilloscopes when using an A Trigger Event to arm a B-Trigger. Suppose, for example, that a user is troubleshooting a system under test that is exhibiting improper operation. The user suspects that undesired signal activity occurs during a 10 microsecond "inactive period" intended to exist after a particular pattern is detected. Using the prior art triggering capabilities shown in FIG. 4, such a user could trigger on the pattern (A Trigger) which then arms the system to trigger on the next rising edge (B Trigger). If the signal activity does occur after the pattern is detected, then all works well. However, suppose the unwanted signal activity does not occur after the pattern is detected. In such a case, the oscilloscope would remain waiting for the B-event to occur. Worse, it may trigger on some other rising edge that may occur at some later time that is not associated with the improper operation being investigated.

The solution to this problem is provided by apparatus according to the subject invention. Once again, suppose, for example, that a user is troubleshooting the same system under test exhibiting the same improper operation. The user suspects that a glitch occurs within 10 microseconds after a particular pattern is detected. Using the triggering capabilities of the subject invention shown in FIG. 5, the user could trigger on the pattern (A Trigger) which then arms the system to trigger on the next glitch (B Trigger). The user may also define that the glitch should occur within 10 microseconds of the A-Event. If the glitch does occur within 10 microseconds after the A-Event (i.e., after the pattern is detected), then all works well. However, if the glitch does not occur within 10 microseconds after the pattern is detected, then Timeout Timer 340 generates and End-of-time signal and applies it to Reset Logic Block 370. Reset Logic Block resets A-Trigger Latch 350. This removes the Enable signal (EN) from B Trigger Latch 360 so that it will no longer wait for the B-trigger glitch to occur. Instead, Event Decoder and Qualifier B 320 and its associated B Trigger Latch 360 will wait for Event Decoder and Qualifier A 310 to trigger on the next occurrence of the particular pattern before again becoming armed to trigger on the next glitch. In this way, the B-trigger glitch will most likely be a glitch associated with the improper operation being investigated.

The reset circuitry of the subject invention can operate to reset when the B trigger event does not occur before a specified timeout (as described above), or when the B trigger event does not occur before a specified input signal enters a specified state, or when the B trigger does not occur before a specified input signal transitions in a specified direction.

Figure 6:
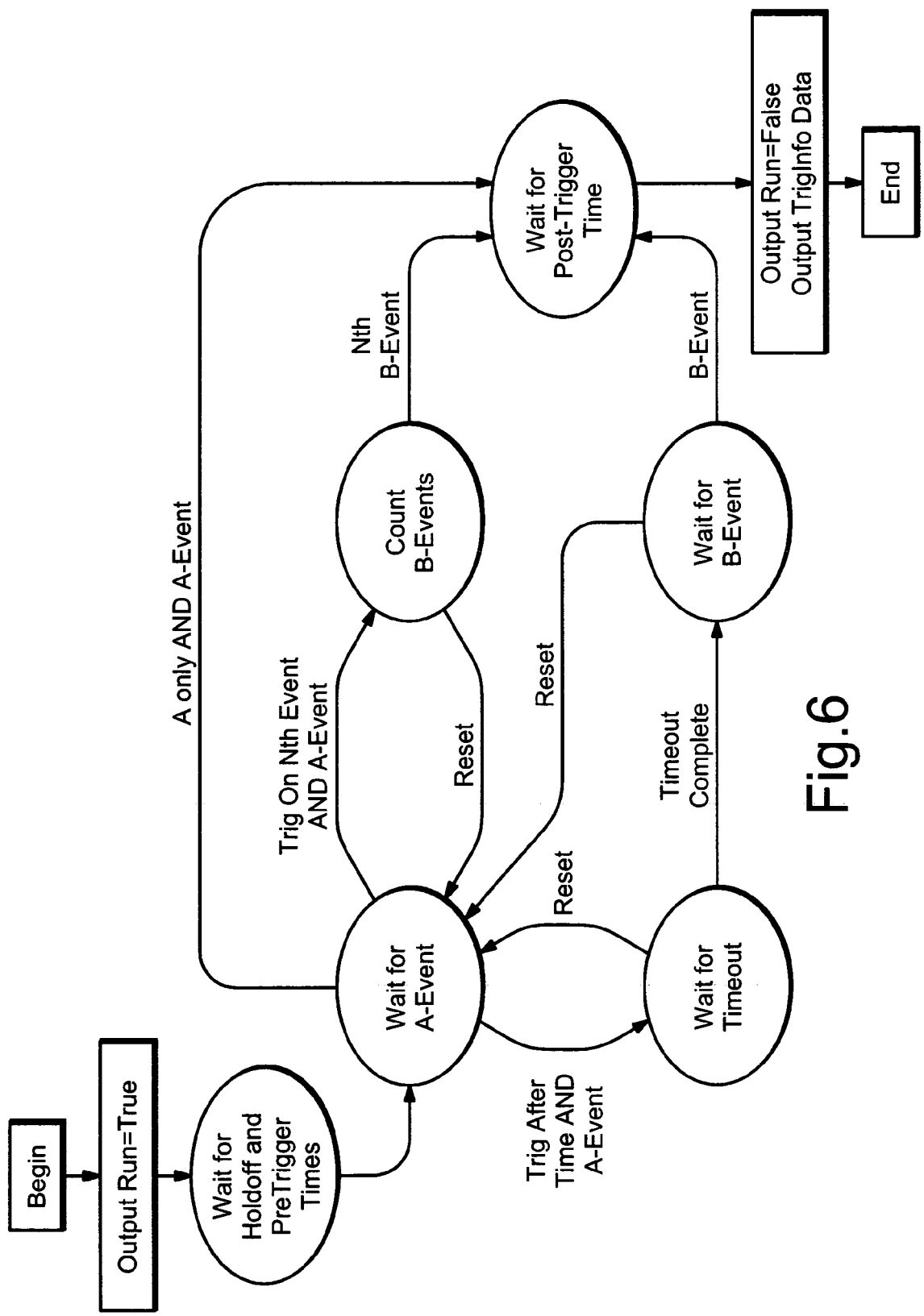
FIG. 6 is a state machine diagram useful for understanding the subject invention.

The apparatus of the subject invention may be described in terms of a state machine, as shown in FIG. 6. The state machine is entered at the upper left and waits for the A-Event to occur. If A-only is selected then the state machine advances to the Wait for Post-trigger state, and exits thereafter. If Trig on Nth Event and A-Event is selected, then the state machine advances to the time B-events state and remains there until the predetermined number of B-events has occurred, or until a reset has occurred. Upon achieving the required number of B-events, the state machine advances to the Wait for Post-trigger state, and exits thereafter. If a reset occurred, then the state machine returns to the Wait for A-Event state. If Trig After Time and A-Event is selected, then the state machine advances to the Wait for Timeout state for the required period (or until a reset is received). If the required period has elapsed, then the state machine advances to the Wait for B-Event state. If a reset occurred, then the state machine returns to the Wait for A-Event state. The state machine will remain in the Wait for B-Event state until the B-Event occurs or until a reset is received. If the B-Event occurs, then the state machine advances to the Wait for Post-trigger state, and exits thereafter. If a reset occurred, then the state machine returns to the Wait for A-Event state.

Figure 7:
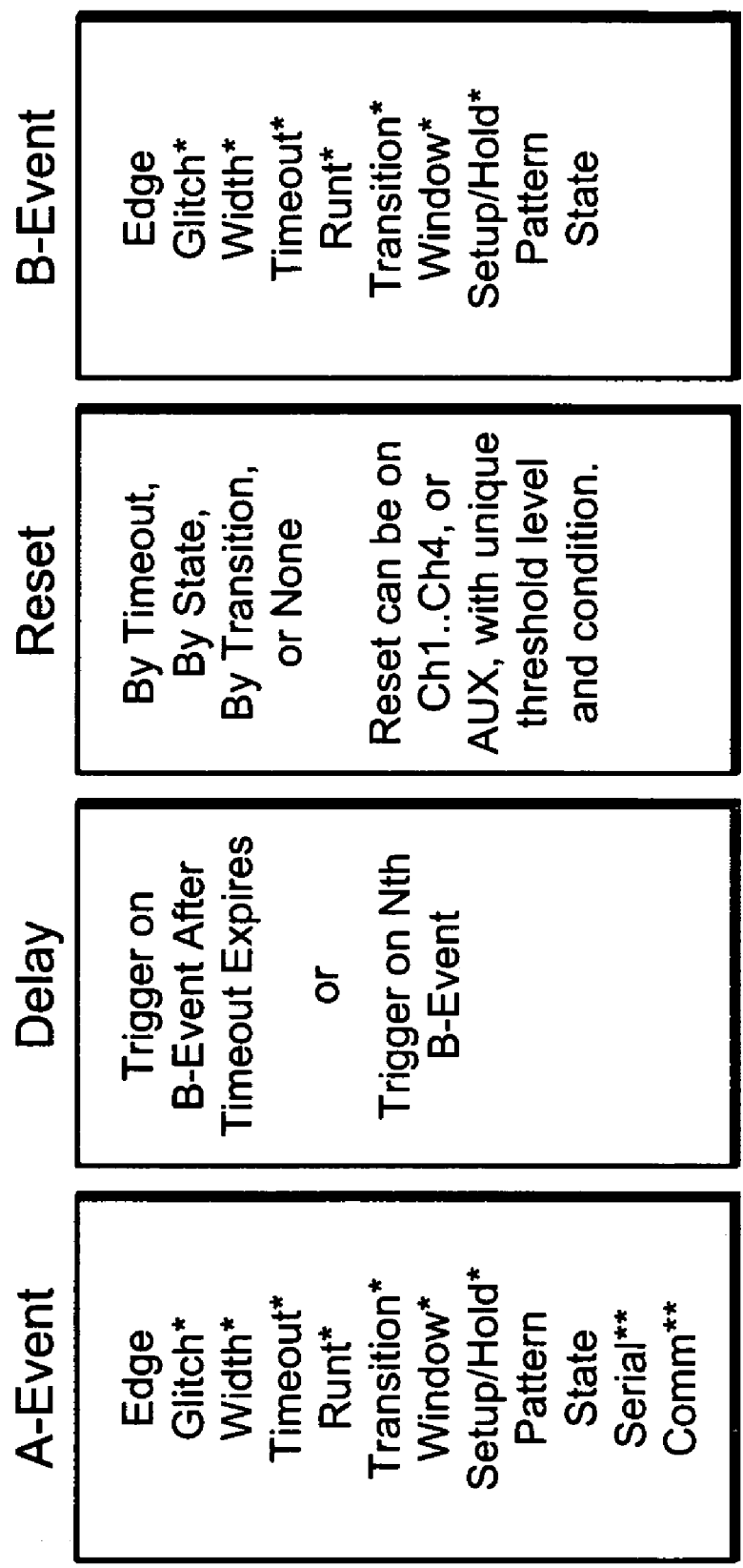
FIG. 7 is an illustration, in tabular form, of selectable continuous-time trigger functions in accordance with the subject invention.

FIG. 7 is an illustration, in tabular form, of selectable trigger functions in accordance with the subject invention. The items bearing an asterisk in the Table of FIG. 7, are those that can be further qualified by logic signals. For example, the term "transition" as used herein means time-qualified transition.

An example of a novel advanced trigger in accordance with the subject invention is as follows. Multi-lane high-speed serial communication links, such as PCI Express or Infiniband, work effectively only when the multiple communication lanes are time-aligned within specific tolerances. Oscilloscopes are sometimes used to measure the time-skew between lanes by triggering on a single character in one data stream and observing the amount of skew time among the lanes. However, taking a few measurements is not a good indicator of whether the lanes remain time correlated over time.

Serial Lane Skew Violation Trigger solves this problem by triggering on out-of-tolerance time-skew between any two lanes. The oscilloscope triggers on out of tolerance time skews between the lanes over any period of time: minutes, hours, days, etc. Any events that violate the skew time can be captured on the display. Pass/Fail Tests for lane skew violation may be implemented using this new trigger type.

Serial Lane Skew Violation Trigger defines the first trigger event at the beginning of the first lane, the second trigger event at the beginning of the second lane, and an interval of time during which any occurrence of the second trigger event is considered out of tolerance. If the first trigger event occurs, but the second trigger event does not occur before the end of the time interval, the Serial Lane Skew Violation Trigger again starts testing for the occurrence of the first trigger event. In this way the oscilloscope triggers when the second trigger event occurs within the specified window of time after the first trigger event occurs.

Serial Lane Skew Violation Trigger is based upon the capabilities of the above-discussed advanced trigger system. It is envisioned that Serial Lane Skew Violation Trigger would be offered as a unique trigger type in an oscilloscope trigger system menu.

Figure 8:
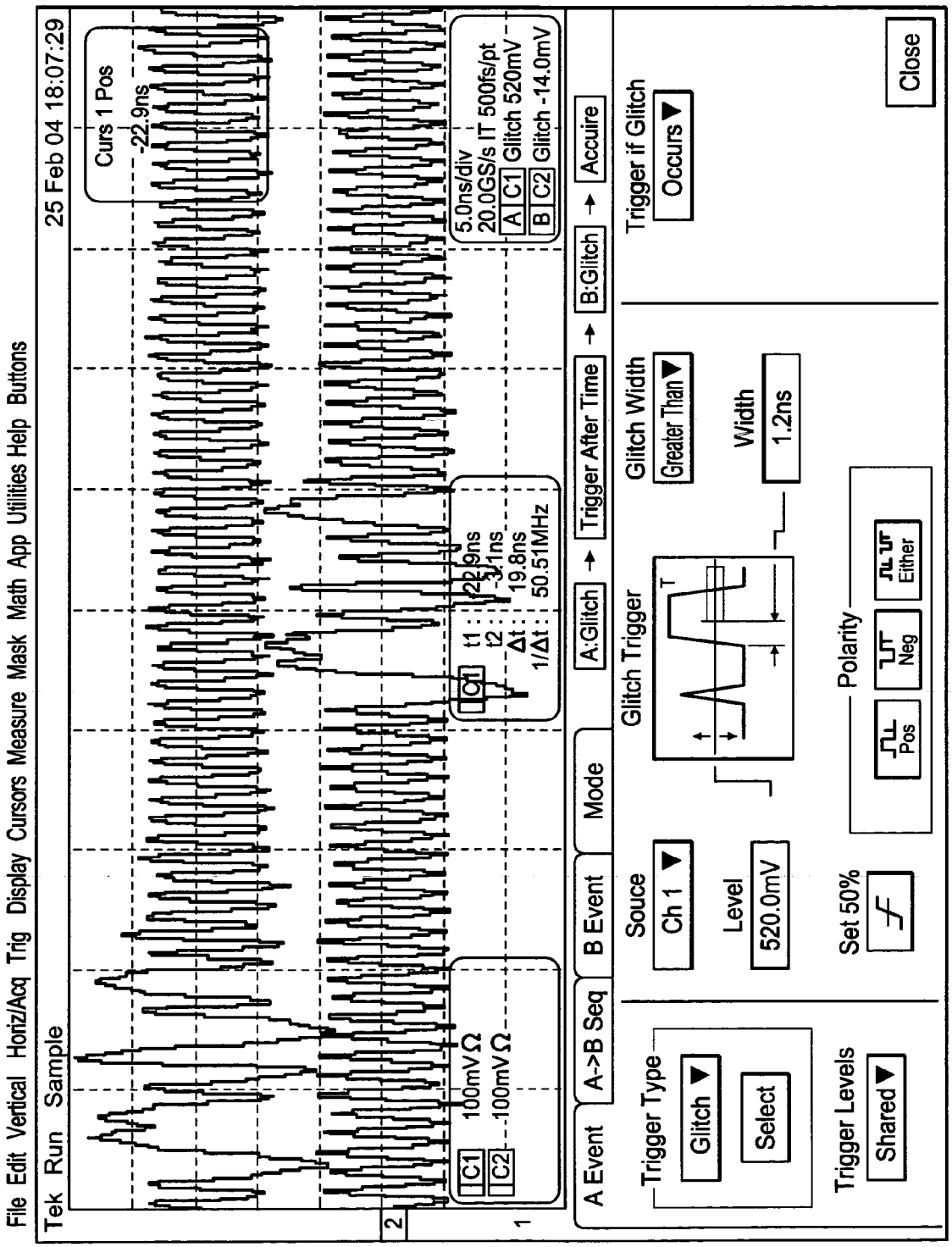
FIGS. 8–10 are illustrations of a display screen of an oscilloscope, and are useful in understanding an aspect of the subject invention.

The screen display of FIG. 8 shows how a trigger event on a first lane, here monitored on Channel 1 (CH 1), as a comma character, may be defined as a "glitch" event of a specific width, greater than four times but less than five times the bit width. There are other means to uniquely identify the beginning of the lane such as serial pattern trigger or width trigger.

Figure 9:
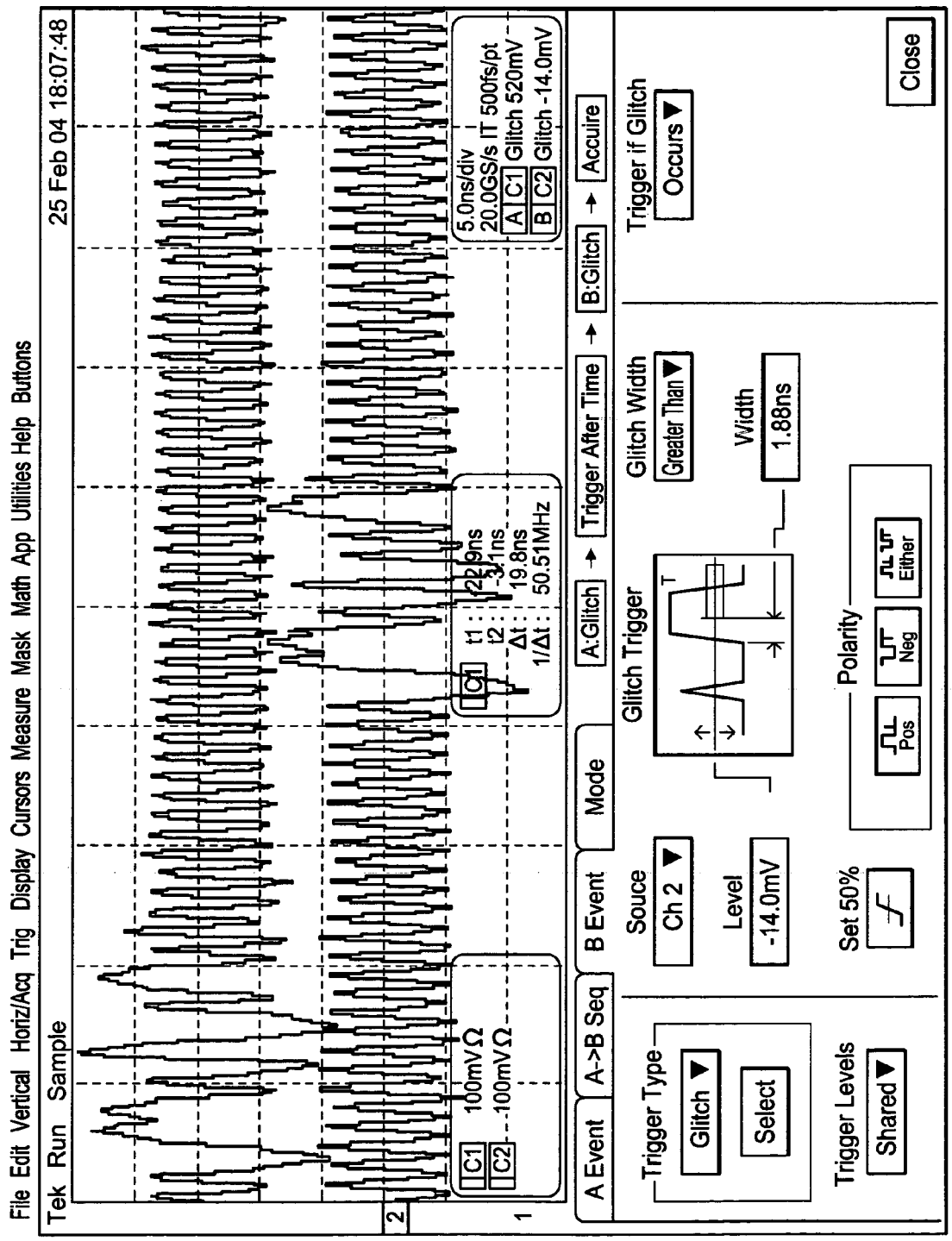

The screen display of FIG. 9 shows how the trigger event on the second lane, here monitored on Channel 2 (CH 2), may also be defined as a "glitch" event of a specific width, greater than four times but less than five times the bit width.

Figure 10:
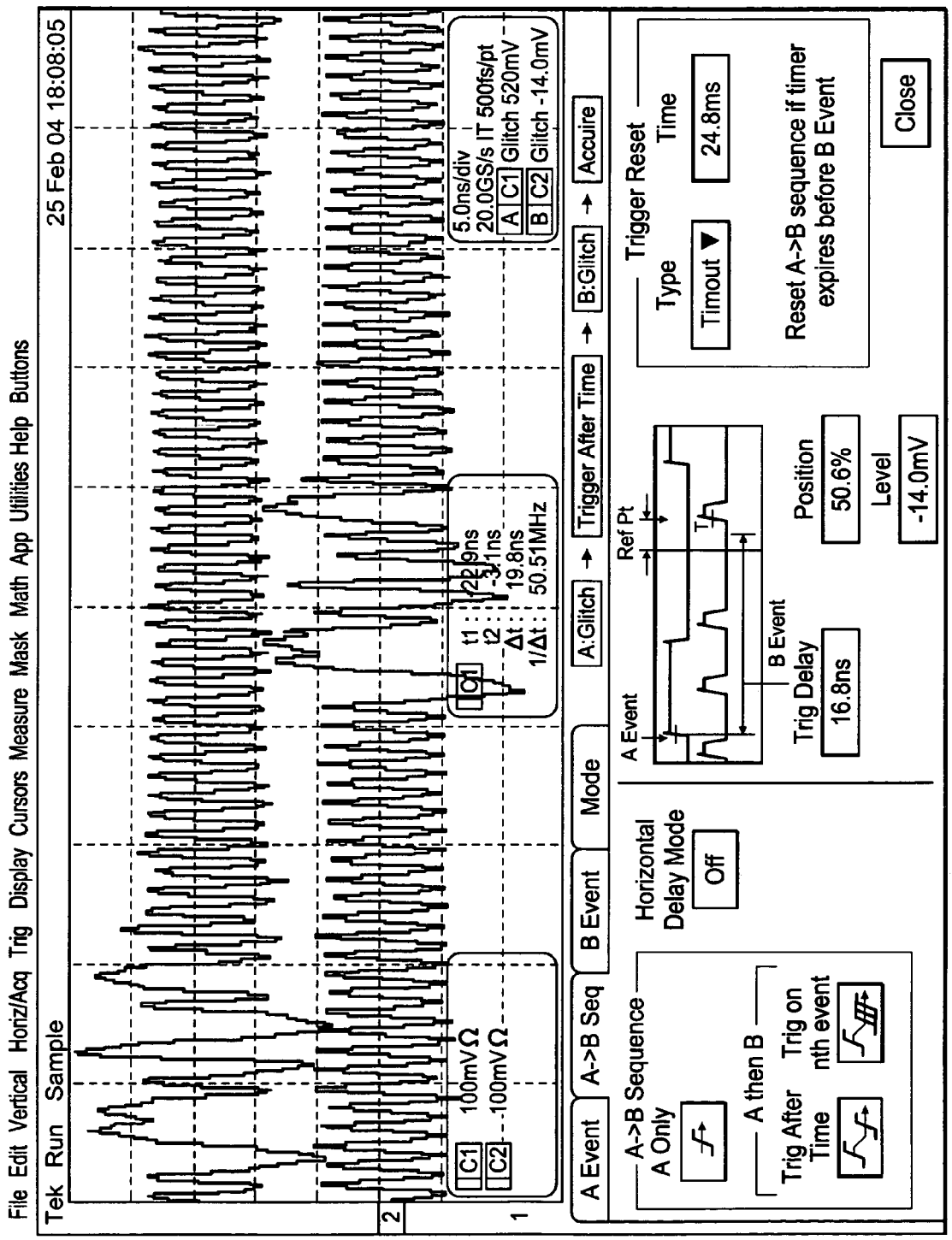

The screen display of FIG. 10 shows how the time interval is defined using both the Trig After Time Trig Delay Time and the Trigger Reset TimeOut Time. Occurrences of trigger events on the second lane within this time interval, monitored here on CH 2, cause the oscilloscope to trigger to capture the out-of-tolerance events. Here, the cursors are also used to measure the time between the trigger event on the first lane and the trigger event on the second lane.

A second example of a novel advanced trigger in accordance with the subject invention is as follows. Serial communication devices based on standards such as Infiniband announce their presence on a communication channel at power up by emitting a "beacon" signal comprising special packet headers and variable length data blocks. When the device powers up into an error condition, the beacon signal contains additional information and persists for a longer period of time. In the past, it has not been possible to trigger when these variable length beacon signals violate the limited width.

Beacon Width Violation Trigger solves this problem by applying several features of the above-described trigger system. Being able to trigger when the Beacon signals violate the width limit, allows the oscilloscope to monitor for an occurrence of the violation over any period of time.

To understand the trigger setup below, note that the beacon signal begins with a special header packet containing a K28.5 comma character and that the beacon signal ends with an idle section of several milliseconds. The Serial Beacon Width Violation Trigger is set up as follows. The A Trigger Event is defined to detect the K28.5 comma character in the beacon signal header packet by triggering on a pulse width of the five ones or five zeroes in the K28.5 character. However, there are other means to detect the K28.5 such as serial pattern recognition. The trigger holdoff is set to be greater than the beacon signal width so that the A trigger event only occurs at the beginning of the Beacon signal. The B Trigger Event is set up to detect the end of the beacon signal by using the Timeout Trigger to detect the idle state of the signal. The beginning of the beacon width violation time window is defined by the end of the Trig Delay time which is the Beacon width specification. Finally, the end of the Beacon width violation time window is defined by the reset time out. With this trigger setup, the oscilloscope will trigger only when the end of the beacon signal occurs within the violation time window.

Figure 11:
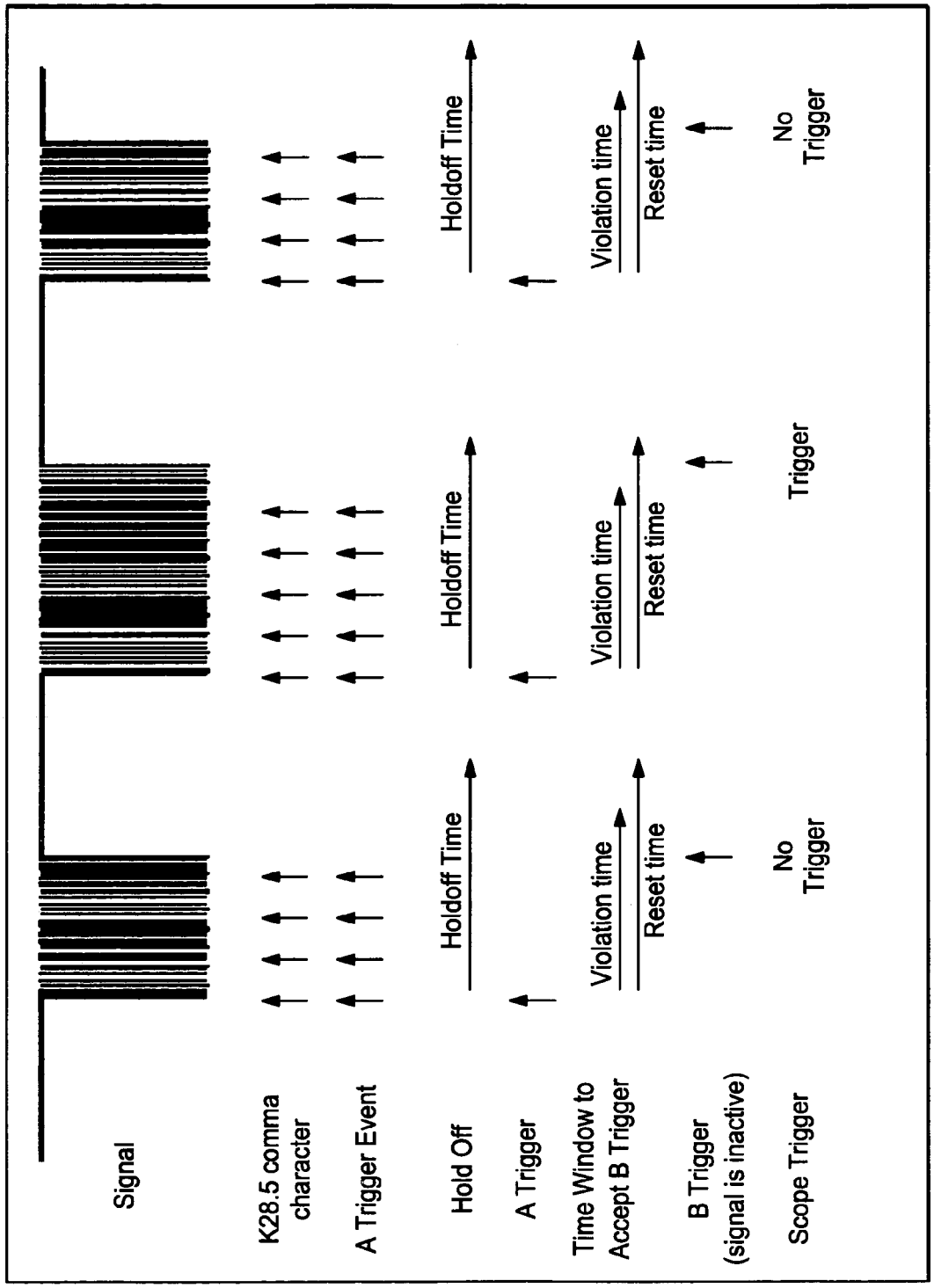
FIG. 11 is a timing diagram useful in understanding an aspect of the subject invention.
Figure 12:
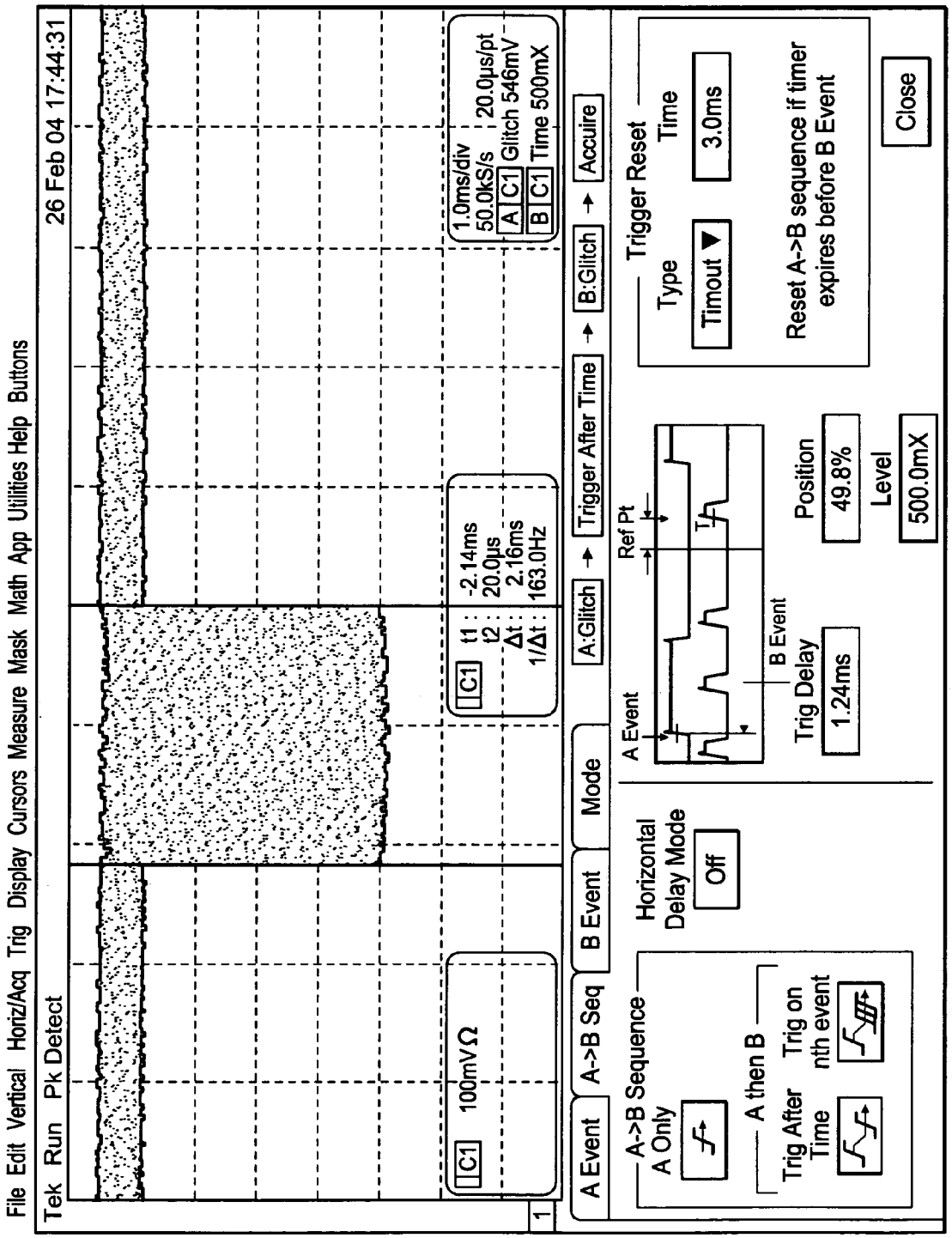
FIGS. 12–14 are illustrations of a display screen of an oscilloscope, and are useful in understanding a further aspect of the subject invention
Figure 13:
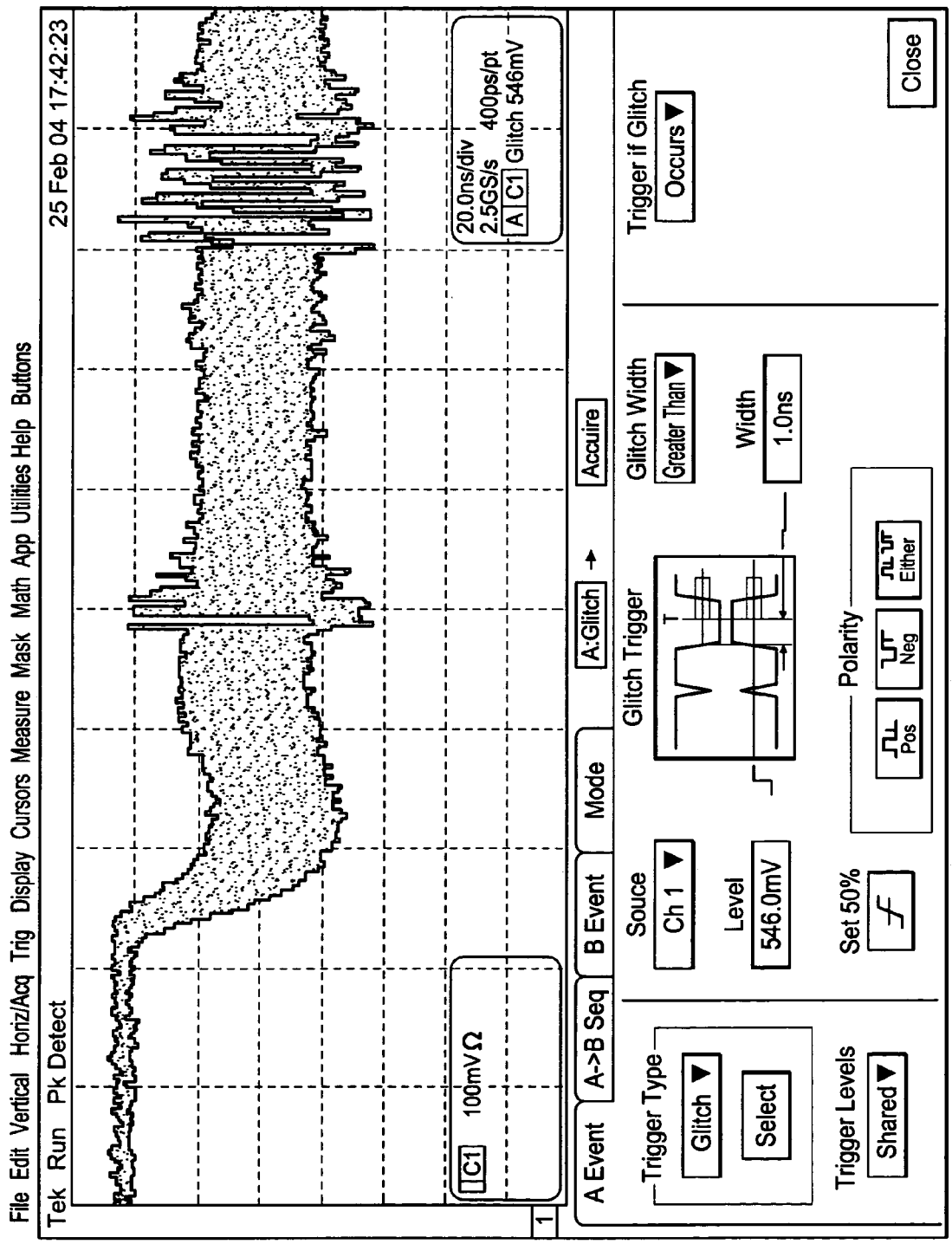
Figure 14:
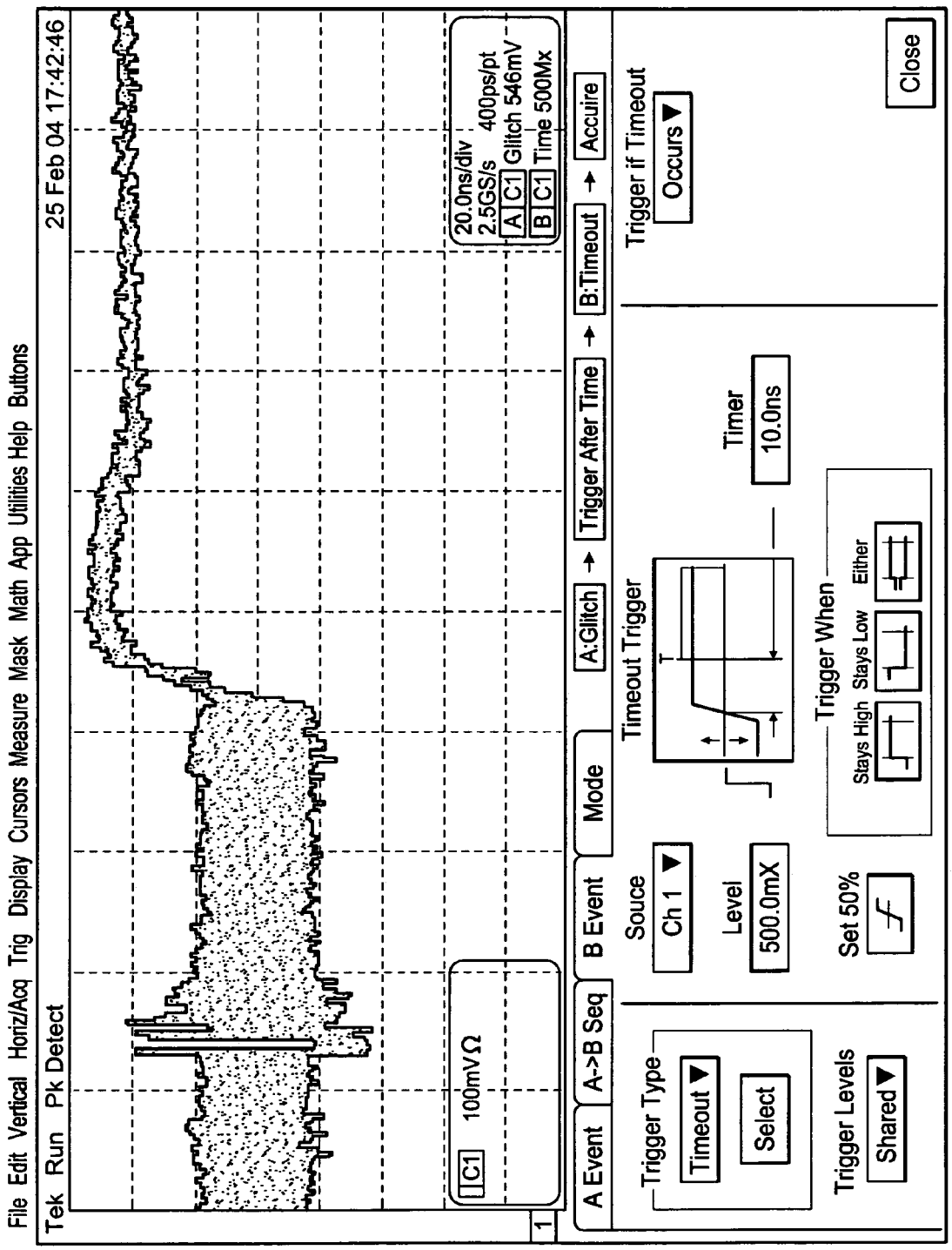

The diagram of FIG. 11 illustrates how the advanced trigger capability of the subject invention can be set up to trigger when the Beacon Width violates the specified width. FIG. 12 shows the entire beacon signal and the A->B Sequence and Trigger Reset conditions required to trigger on the signal when it persists into the violation time window. FIG. 13 shows the leading edge of the beacon signal and one of several possible methods of triggering on the K28.5 comma character at the start of the beacon signal. FIG. 14 shows the trailing edge of the beacon signal and one method for setting the B-Trigger Event to trigger when the beacon signal persists into the violation time window.

It should be noted that the above-described advanced triggering is also able to perform at the same performance level as the performance specifications of the oscilloscope, when it is fabricated as an ASIC using high-speed buffers and multiplexers employing SiGe (silicon germanium) technology.

In summary, the advanced triggering of the subject invention provides the highest performance, broadest selection of trigger types and the most flexible range of choices, qualifiers and parameters, including advanced B triggering, previously not available in any oscilloscope on the market and only found for A-triggering on a few advanced oscilloscopes. In addition advanced triggering is based on advanced SiGe technology, providing ultra-low trigger jitter for capturing events of interest with superior precision.

What is claimed is:

1. An oscilloscope having advanced trigger circuitry, comprising:

a control operated by a user to select one of a first plurality of continuous-time trigger events, and one of a second plurality of continuous-time trigger events;

a first trigger decoder for triggering on an occurrence of said selected one of said first plurality of continuous-time trigger events and providing a first trigger signal; and a second trigger decoder for triggering on an occurrence of said selected one of said second plurality of continuous-time trigger events and providing a second trigger signal, said second trigger decoder being armed for triggering in response to said first trigger signal;

a timer for timing a time period, a duration of said time period being programmable by a user, said timer beginning to time said time period in response to said first trigger signal, said timer generating an end-of-time signal at an expiration of said time period; and a reset circuit responsive to said end-of-time signal of said timer for resetting said first trigger decoder if said selected one of said second plurality of continuous-time trigger events failed to occur before said end-of-time signal was generated.

2. The oscilloscope of claim 1, wherein
said first trigger decoder detects an occurrence of a selected one of said first plurality of continuous-time tripper events;
said first and second pluralities of continuous-time tripper events consist of an edge, a glitch signal, a signal having a predetermined width, a time-out condition, a runt signal, a time-qualified transition, a predetermined window, a predetermined period, a setup/hold violation time a predetermined pattern, a clock-qualified state, a Serial pattern, or a Comm event; and
in response to a detection of said occurrence of said selected one of said first plurality of continuous-time trigger events, said first trigger decoder arms said second trigger decoder to trigger on an occurrence of said selected one of said second plurality of continuous-time trigger events.

3. The oscilloscope of claim 2, wherein
said selected one of said second plurality of continuous-time trigger events is a glitch signal.

4. The oscilloscope of claim 2, wherein
said selected one of said second plurality of continuous-time trigger events is a signal having a predetermined width; wherein
said predetermined widths of said signal having a predetermined width of said first plurality of continuous-time triggers and said signal having a predetermined width of said second plurality of continuous-time triggers may be of the same value.

5. The oscilloscope of claim 2, wherein
said selected one of said second plurality of continuous-time trigger events is time-out condition; wherein
said time-out condition of said first plurality of continuous-time triggers and said time-out condition of said second plurality of continuous-time triggers may be of the same value.

6. The oscilloscope of claim 2, wherein
said selected one of said second plurality of continuous-time trigger events is runt signal.

7. The oscilloscope of claim 2, wherein
said selected one of said second plurality of continuous-time trigger events is time-qualified transition; wherein
said time-qualified transition of said first plurality of continuous-time triggers and said time-qualified transition of said second plurality of continuous-time triggers may be of the same value.

8. The oscilloscope of claim 2, wherein
said selected one of said second plurality of continuous-time trigger events is predetermined window; wherein
said predetermined window of said first plurality of continuous-time triggers and said predetermined window of said second plurality of continuous-time triggers may be of the same value.

9. The oscilloscope of claim 2, wherein
said selected one of said second plurality of continuous-time trigger events is predetermined period; wherein
said predetermined period of said first plurality of continuous-time triggers and said predetermined period of said second plurality of continuous-time triggers may be of the same value.

10. The oscilloscope of claim 2, wherein
said selected one of said second plurality of continuous-time trigger events is setup/hold violation time; wherein said setup/hold violation time of said first plurality of continuous-time triggers and said setup/hold violation time of said second plurality of continuous-time triggers may be of the same value.

11. The oscilloscope of claim 2, wherein
said selected one of said second plurality of continuous-time trigger events is predetermined pattern; wherein
said predetermined pattern of said first plurality of continuous-time triggers and said predetermined perod of said second plurality of continuous-time triggers may be identical.

12. The oscilloscope of claim 2, wherein
said selected one of said second plurality of continuous-time trigger events is predetermined clock-qualified state; wherein
said predetermined clock-qualified state of said first plurality of continuous-time triggers and said predetermined clock-qualified state of said second plurality of continuous-time triggers may be of the same value.

13. The oscilloscope of claim 2, wherein
said selected one of said second plurality of continuous-time trigger events is predetermined serial pattern; wherein
said predetermined serial pattern of said first plurality of continuous-time triggers and said predetermined serial pattern of said second plurality of continuous-time triggers may be identical.

14. The oscilloscope of claim 2, wherein
said selected one of said second plurality of continuous-time trigger events is predetermined Comm event; wherein
said predetermined Comm event of said first plurality of continuous-time triggers and said predetermined Comm event of said second plurality of continuous-time triggers may be identical.

15. The oscilloscope of claim 1, wherein
said first trigger decoder is programmed to detect a predetermined character from a first channel;
said second trigger decoder is programmed to detect a predetermined character from a second channel; and further including:
a delay unit for providing a programmable delay substantially equal to a maximum allowed lane skew time for delaying said arming of said second trigger decoder;
said timer being set for a period longer than said delay and shorter than the expected time until the next occurrence of said predetermined character from said first channel; wherein
said predetermined character of said first plurality of continuous-time triggers and said predetermined character of said second plurality of continuous-time triggers may be identical.

16. The oscilloscope of claim 1, wherein
said first trigger decoder is programmed to detect a predetermined character of an input signal and providing a first trigger signal in response thereto;
said second trigger decoder is programmed to detect when said input signal is inactive and providing a second trigger signal in response thereto; and further including:
a delay unit responsive to said first trigger signal for providing a programmable delay substantially equal to a maximum beacon width for delaying said arming of said second trigger decoder;
said timer being responsive to said second trigger signal and being set for a period longer than said delay and shorter than the expected time until the next occurrence of said predetermined character.

17. An oscilloscope having advanced trigger circuitry, comprising:
- a control operated by a user to select one of a first plurality of continuous-time trigger events, one of a second plurality of continuous-time trigger events, and one of a third plurality of continuous-time trigger events;
- a first trigger decoder for triggering on said selected one of said first plurality of continuous-time trigger events and providing a first trigger signal;
- a second trigger decoder for triggering on said selected one of said second plurality of continuous-time trigger events and providing a second trigger signal, said second trigger decoder being armed for triggering in response to said first trigger signal; and
- a third trigger decoder for triggering on said selected one of said third plurality of continuous-time trigger events and providing a third trigger signal;
- a reset decoder for generating a reset signal in response to an occurrence of said selected one of said third plurality of continuous-time trigger events, said reset decoder applying said reset signal to a reset circuit;
- said reset circuit being responsive to said reset signal for resetting said first trigger decoder if said selected one of said second plurality of continuous-time trigger events failed to occur before said reset signal was generated.

18. An oscilloscope having advanced trigger circuitry, comprising:
- a control operated by a user to select one of a first plurality of continuous-time trigger events, one of a second plurality of continuous-time trigger events, and one of a third plurality of continuous-time trigger events;
- a plurality of comparators for comparing continuous-time events of a received signal to a respective plurality of programmable threshold values;
- a first trigger decoder for triggering on said selected one of said first plurality of continuous-time trigger events selectively provided from among said plurality of comparators and providing a first trigger signal;
- a second trigger decoder for triggering on said selected one of said second plurality of continuous-time trigger events selectively provided from among said plurality of comparators and providing a second trigger signal, said second trigger decoder being armed for triggering in response to said first trigger signal;
- a third trigger decoder for triggering on said selected one of said third plurality of continuous-time trigger events selectively provided from among said plurality of comparators and providing a third trigger signal;
- a timer for timing a time period, a duration of said time period being programmable by a user, said timer beginning to time said time period in response to said first trigger signal, said timer generating an end-of-time signal at an expiration of said time period; and
- a reset decoder for generating a reset signal in response to an occurrence of said selected one of a said third plurality of continuous-time trigger events; and
- a reset circuit responsive to said reset signal and to said end-of-time signal for resetting said first trigger decoder if said selected one of said second plurality of continuous-time trigger events failed to occur before said reset signal or said end of time signal were generated.

19. The oscilloscope of claim 18, wherein
said first trigger decoder detects an occurrence of a selected one of said first plurality of continuous-time trigger events;
said first, second, and third pluralities of continuous-time trigger events consist of an edge, a glitch signal, a signal having a predetermined width, a time-out condition, a runt signal, a time-qualified transition, a predetermined window, a predetermined period, a setup/hold violation time, a predetermined pattern, a clock-qualified state, a serial pattern, or a Comm event; and
in response to a detection of said occurrence of said selected one of said first plurality of continuous-time trigger events, said first trigger decoder arms said second trigger decoder to trigger on an occurrence of said selected one of said second plurality of continuous-time trigger events.

20. The oscilloscope of claim 19, wherein
said selected one of said second plurality of continuous-time trigger events is glitch signal.

21. The oscilloscope of claim 19, wherein
said selected one of said second plurality of continuous-time trigger events is a signal having a predetermined width; wherein
said predetermined width of said signal having a predetermined width of said first plurality of continuous-time triggers and said predetermined width of said signal having a predetermined width of said second plurality of continuous-time triggers may be of the same value.

22. The oscilloscope of claim 19, wherein
said selected one of said second plurality of continuous-time trigger events is time-out condition; wherein
said time-out condition of said first plurality of continuous-time triggers and said time-out condition of said second plurality of continuous-time triggers may be of the same value.

23. The oscilloscope of claim 19, wherein
said selected one of said second plurality of continuous-time trigger events is runt signal.

24. The oscilloscope of claim 19, wherein
said selected one of said second plurality of continuous-time trigger events is time-qualified transition; wherein
said time-qualified transition of said first plurality of continuous-time triggers and said time-qualified transition of said second plurality of continuous-time triggers may be of the same value.

25. The oscilloscope of claim 19, wherein
said selected one of said second plurality of continuous-time trigger events is predetermined window; wherein
said predetermined window of said first plurality of continuous-time triggers and said predetermined window of said second plurality of continuous-time triggers may be of the same value.

26. The oscilloscope of claim 19, wherein
said selected one of said second plurality of continuous-time trigger events is predetermined period; wherein
said predetermined period of said first plurality of continuous-time triggers and said predetermined period of said second plurality of continuous-time triggers may be of the same value.

27. The oscilloscope of claim 19, wherein
said selected one of said second plurality of continuous-time trigger events is setup/hold violation time; wherein
said setup/hold violation time of said first plurality of continuous-time triggers and said setup/hold violation time of said second plurality of continuous-time triggers may be identical.

28. The oscilloscope of claim 19, wherein
said selected one of said second plurality of continuous-time trigger events is a predetermined pattern; wherein said predetermined pattern of said first plurality of continuous-time triggers and said predetermined pattern of said second plurality of continuous-time triggers may be identical.

29. The oscilloscope of claim 19, wherein
said selected one of said second plurality of continuous-time trigger events is predetermined clock-qualified state; wherein
said predetermined clock-qualified state of said first plurality of continuous-time triggers and said predetermined clock-qualified state of said second plurality of continuous-time triggers may be of the same value.

30. The oscilloscope of claim 19, wherein
said selected one of said second plurality of continuous-time trigger events is predetermined serial pattern; wherein
said predetermined serial pattern of said first plurality of continuous-time triggers and said predetermined serial pattern of said second plurality of continuous-time triggers may be identical.

31. The oscilloscope of claim 19, wherein
said selected one of said second plurality of continuous-time trigger events is predetermined Comm event; wherein
said predetermined Comm event of said first plurality of continuous-time triggers and said predetermined Comm event of said second plurality of continuous-time triggers may be identical.

32. The oscilloscope of claim 18, wherein
said first trigger decoder is programmed to detect a first predetermined character from a first channel;
said second trigger decoder is programmed to detect a second predetermined character from a second channel; and further including:
a delay unit for providing a programmable delay substantially equal to a maximum allowed lane skew time for delaying said arming of said second trigger decoder;
said timer being set for a period longer than said delay and shorter than the expected time until the next occurrence of said predetermined character from said first channel; wherein
said first and second predetermined characters may be identical.

33. The oscilloscope of claim 18, wherein
said first trigger decoder is programmed to detect a predetermined character of an input signal;
said second trigger decoder is programmed to detect when said input signal is inactive; and further including:
a delay unit for providing a programmable delay substantially equal to a maximum beacon width for delaying said arming of said second trigger decoder;
said timer being set for a period longer than said delay and shorter than the expected time until the next occurrence of said predetermined character.

34. An oscilloscope having advanced trigger circuitry, comprising:
a plurality of comparators for comparing continuous-time events of a received signal to a respective plurality of programmable threshold values;
said comparators including user-selectable coupling, said user-selectable coupling including at least DC coupling and AC coupling;
a first trigger decoder for triggering on a selected one of a first plurality of continuous-time trigger events selectively provided from among said plurality of comparators and providing a first trigger signal; and
a second trigger decoder for triggering on a selected one of a second plurality of continuous-time trigger events selectively provided from among said plurality of comparators and providing a second trigger signal, said second trigger decoder being armed for triggering in response to said first trigger signal.

35. The oscilloscope of claim 34, wherein
said user-selectable coupling further includes at least one of High Frequency Reject coupling, Low Frequency coupling, or Noise Reject coupling.

* * * * *